(12) United States Patent
Hsieh

(10) Patent No.: US 7,897,997 B2
(45) Date of Patent: Mar. 1, 2011

(54) TRENCH IGBT WITH TRENCH GATES UNDERNEATH CONTACT AREAS OF PROTECTION DIODES

(75) Inventor: Fu-Yuan Hsieh, Kaohsiung (TW)

(73) Assignee: Force Mos Technology Co., Ltd., Kaohsiung (TW)

( * ) Notice: Subject to any disclaimer, the term of this patent is extended or adjusted under 35 U.S.C. 154(b) by 0 days.

(21) Appl. No.: 12/385,639

(22) Filed: Apr. 15, 2009

(65) Prior Publication Data

US 2009/0212321 A1      Aug. 27, 2009

Related U.S. Application Data

(63) Continuation-in-part of application No. 12/036,248, filed on Feb. 23, 2008.

(51) Int. Cl.
*H01L 29/739* (2006.01)
(52) U.S. Cl. .............. 257/139; 257/341; 257/328; 257/302

(58) Field of Classification Search ............... 257/199, 257/360–363, 367, 370, 497, E21.382, E29.027, 257/E29.066, E29.197, E29.201; 438/133, 438/309
See application file for complete search history.

(56) References Cited

U.S. PATENT DOCUMENTS

| | | | | |
|---|---|---|---|---|
| 5,365,099 | A * | 11/1994 | Phipps et al. | 257/328 |
| 6,246,092 | B1 * | 6/2001 | Fujihira et al. | 257/341 |
| 7,345,342 | B2 * | 3/2008 | Challa et al. | 257/341 |
| 2003/0042525 | A1 * | 3/2003 | Tanaka | 257/302 |

* cited by examiner

*Primary Examiner*—Wai-Sing Louie
*Assistant Examiner*—Sue Tang
(74) *Attorney, Agent, or Firm*—Bacon & Thomas, PLLC

(57) ABSTRACT

A trench PT IGBT (or NPT IGBT) having clamp diodes for ESD protection and prevention of shortage among gate, emitter and collector. The clamp diodes comprise multiple back-to-back Zener Diode composed of doped regions in a poly-silicon layer doped with dopant ions of a first conductivity type next to a second conductivity type disposed on an insulation layer above said semiconductor power device. Trench gates are formed underneath the contact areas of the clamp diodes as the buffer layer for prevention of shortage.

21 Claims, 18 Drawing Sheets

TRENCH IGBT WITH TRENCH GATES UNDERNEATH CONTACT AREAS OF PROTECTION DIODES

CROSS REFERENCE TO RELATED APPLICATION

This application is a continuation in part of U.S. patent application Ser. No. 12/036,248 filed on Feb. 23, 2008

BACKGROUND OF THE INVENTION

1. Field of the Invention

This invention relates generally to the cell structure, device configuration and fabrication process of trench Punch-Through insulated gate bipolar transistor (PT IGBT) and trench Non Punch-Through insulated gate bipolar transistor (NPT IGBT). More particularly, this invention relates to an improved device configuration and process to manufacture PT IGBT and NPT IGBT with ESD (electrostatic discharge) protection having the characteristics of preventing emitter, gate and collector shortage issue from happening.

2. Description of the Related Art

In order to enhance the ESD protection for trench PT IGBT and NPT IGBT, many different configurations are disclosed in prior arts with G-E Clamp Diodes or G-C Clamp Diodes or with G-E and G-C Clamp Diodes for G-E and G-C protection, respectively. As shown in FIG. 1, a conventional trench PT IGBT cell of prior art with G-E Clamp Diodes for ESD protection is illustrated. The structure further comprises: a P+ substrate 100 coated with back metal 101 on its rear side as Collector; a moderately doped N epitaxial layer 102 sandwiched between a lightly doped N− epitaxial layer 103 and the P+ substrate 100; a plurality of trenches and at least a wider trench opened within N− epitaxial layer 103 and filled with polysilicon to respectively serve as trench gates 124 and at least a wider trench gate 124' for gate connection over a layer of gate oxide 130; P base region 104 extending among said trench gates with N+ emitter regions 105 near its top surface between two adjacent trench gates 124; a doped polysilicon layer overlying a portion of the thin oxide layer 136 as ESD protection diodes comprising two back to back Zener diodes which arranged as n+/p/n+/p/n+. Through trench contacts 126 and 127, one cathode 145 of the ESD protection diode, as well as emitter region and base region, are all connected to emitter metal 132 while another cathode 145' together with trench gate 124' are connected to gate metal 134 through trench contacts 128 and 129. Specially, around the bottom of each trench emitter contact and trench base contact, a P+ area is formed to reduce the resistance between base region and metal plug filled in trench contacts.

Though trench contacts employed in this prior art have better connection stability and higher device density than planar contact used in other conventional art, it will still encounter another hazardous shortage issue, which happens between gate and emitter when trench contacts 127 and 128 are over etched through ESD protection diodes and thin oxide layer 136 and into P base region 104 during fabrication process, causing accordingly low yield and reliability issues, as shown in FIG. 2. Unfortunately, this shortage problem induced by over etching may also be found in cases when G-C clamp diodes are applied as well as in conventional trench NPT IGBT with protection diodes.

Accordingly, it would be desirable to provide a trench PT IGBT (or NPT IGBT) cell with improved configuration to avoid the shortage issue resulted from over etching.

SUMMARY OF THE INVENTION

It is therefore an object of the present invention to provide new and improved trench PT IGBT (or NPT IGBT) cell and manufacture process to prevent shortage issue discussed above from happening when trench contacts are applied.

One advantage of the present invention is that, additional trench gates with a wider trench width than the trench contacts are applied in a lightly doped epitaxial layer right below trench contacts in ESD protection diodes as buffer trenched gates. By employing this configuration, no shortage issue will happen even if over etching takes place during the manufacturing process because the trench contacts touch the buffer trenched gates instead of the lightly doped epitaxial layer.

Another advantage of the present invention is that, no additional cost is required to implement the trench gates underneath contact areas of protection diodes since the trench gates can be formed at the same step as other trench gates formed.

Another advantage of the present invention is that, the inventive structure is suitable for both PT IGBT and NPT IGBT with G-C Clamp Diodes or with G-E Clamp Diodes or with G-C and G-E Clamp Diodes.

Briefly, in a preferred embodiment, as shown in FIG. 3B, the present invention discloses a trench PT IGBT cell with G-E Clamp Diodes for G-E ESD protection. The transistor cell comprises: a first epitaxial layer moderately doped with a first semiconductor doping type (e.g., N dopant) grown onto a substrate heavily doped with a second semiconductor doping type (e.g., P dopant) coated with a back metal on its rear side; a second epitaxial layer lightly doped with the same doping type as the first epitaxial layer and grown whereon; a plurality of trenches and at least a wider trench etched within the second epitaxial layer and filled with doped poly over a gate oxide layer to form trench gates and at least a wider trench gate for gate connection; base regions formed within the top portion of the second epitaxial layer and moderately doped with the opposite doping type to epitaxial layer; emitter regions heavily doped with the same doping type as the epitaxial layer near the front surface of base region between two adjacent trench gates; a doped polysilicon layer overlying a portion of the insulating layer as ESD protection diodes comprising multiple back to back Zener diodes which composed of doping areas of a first semiconductor doping type next to doping areas of a second semiconductor doping type; trench contacts penetrating through a thick dielectric interlayer and emitter, and extending into base regions, two cathodes of ESD protection diodes, and at least a wider trench gate to electrically connect the emitter regions, the base regions and one cathode of ESD protection diodes to the emitter metal, and to electrically connect the trench gate and another cathode of ESD protection diodes to the gate metal, respectively; an area heavily doped with the same doping type as base region around each bottom of trench emitter contact and trench base contact to reduce contact resistance between base region and metal plug filled in trench contacts. Specially, additional trench gates are formed right underneath each trench contact of the ESD protection diodes as a buffer layer to avoid G-E shortage issue.

Briefly, in another preferred embodiment, as shown in FIG. 4B, the present invention discloses a trench PT IGBT cell with G-C Clamp Diodes for G-C protection. Different from configuration in FIG. 3B, here one cathode of the ESD protection diodes is connected to gate metal while another is connected to collector metal. However, despite all that, there are still inventive trench gates right underneath each trench contact of G-C protection diodes to ward off the happening of shortage issue between G-C, or G-E, or G-C-E resulted from trench contacts of ESD protection over etching to base regions.

Briefly, in another preferred embodiment, as shown in FIG. 5B, the present invention discloses a trench PT IGBT cell with both G-E and G-C Clamp Diodes for G-E and G-C ESD protection, respectively. The pluralities of Zener Diodes contain at least three cathodes to be connected to gate metal, emitter metal and collector metal, respectively. Underneath each trench contact of protection diodes, a trench gate is formed to ward off the shortage of gate and collector to emitter resulted from trench contacts of ESD protection over etching to base regions.

Briefly, in another preferred embodiment, as shown in FIG. 6B, the present invention discloses a trench NPT IGBT cell which is similar to the configuration in FIG. 3B, except that, the two epitaxial layers onto substrate are replaced by one floating zone substrate which is lightly doped with the opposite semiconductor doping type to substrate whereunder.

Briefly, in another preferred embodiment, as shown in FIG. 7, the present invention discloses a trench NPT IGBT cell which is similar to the configuration in FIG. 4B, except that, the two epitaxial layers onto substrate are replaced by one floating zone substrate which is lightly doped with the opposite semiconductor doping type to substrate whereunder.

Briefly, in another preferred embodiment, as shown in FIG. 8, the present invention discloses a trench NPT IGBT cell which is similar to the configuration in FIG. 5B, except that, the two epitaxial layers onto substrate are replaced by one floating zone substrate which is lightly doped with the opposite semiconductor doping type to substrate whereunder.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Figure 1:
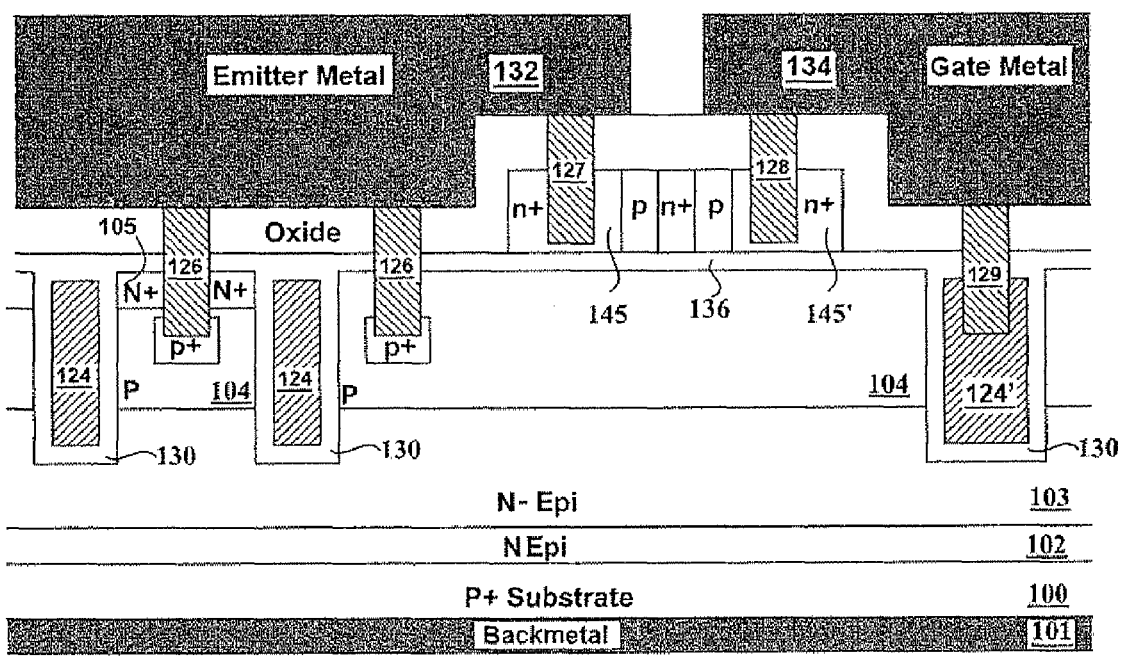
FIG. 1 shows a cross-section of a conventional trench PT IGBT structure of prior art with ESD protection.
Figure 2:
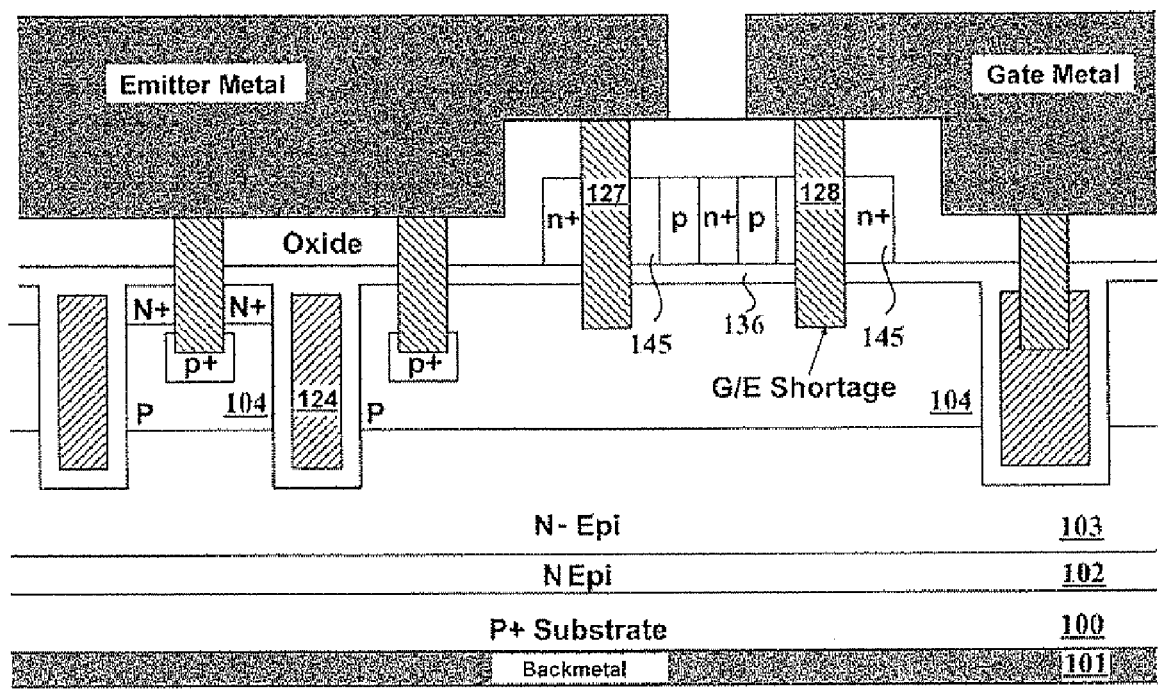
FIG. 2 shows the shortage issue of the conventional trench PT IGBT structure when trench contacts of protection diodes are over etched.
Figure 3A:
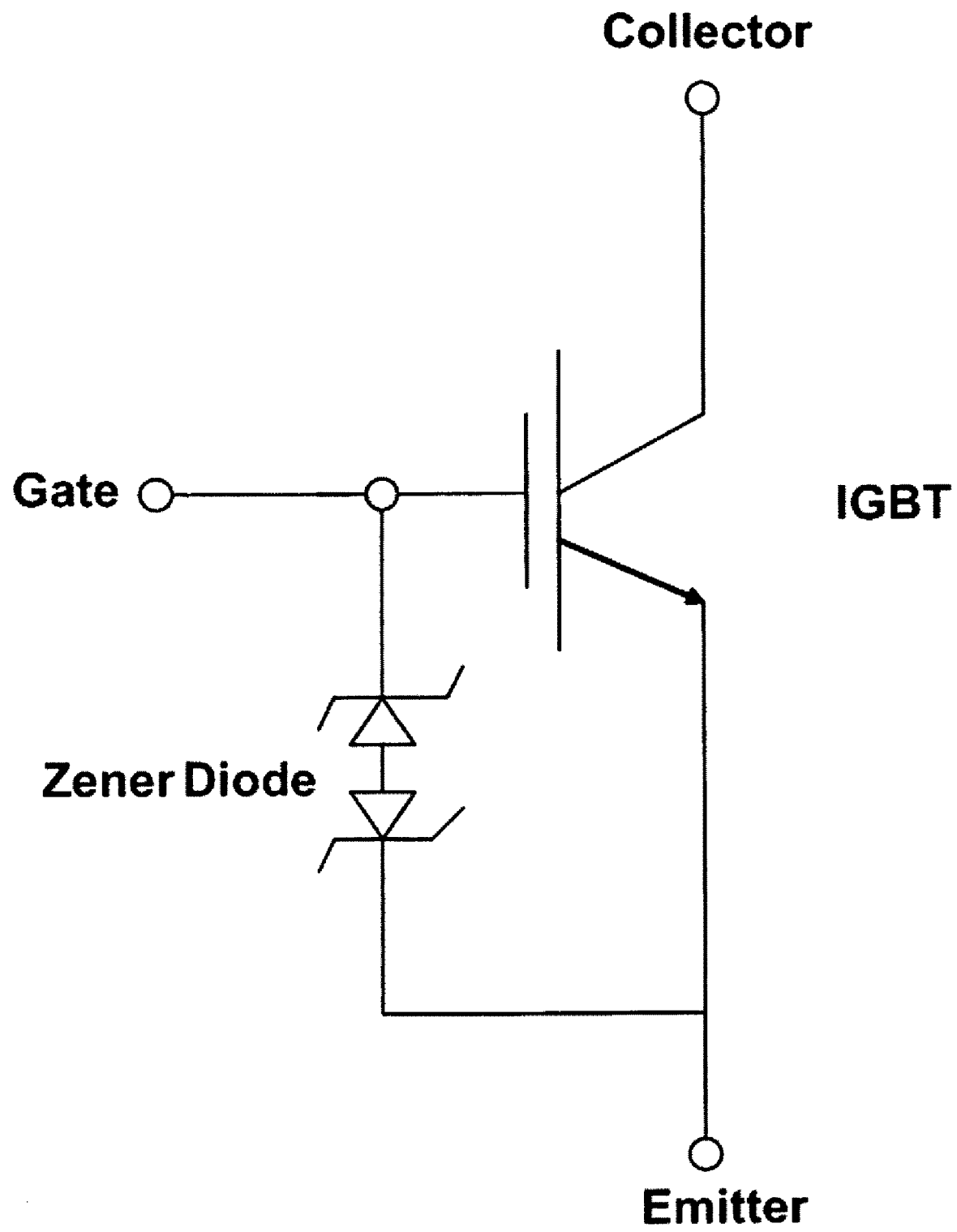
FIG. 3A and FIG. 3B are respectively a circuit diagram and a side cross sectional view of a trench PT IGBT of a first embodiment of the present invention.
Figure 3B:
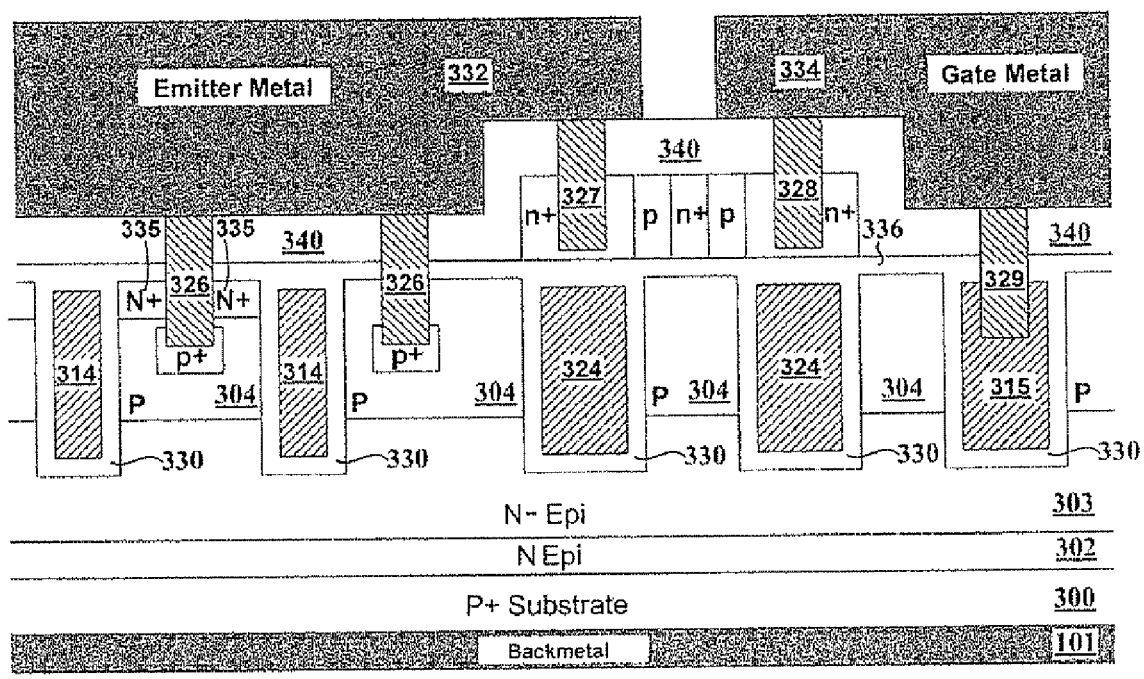

Please refer to FIG. 3A to FIG. 3B for a circuit diagram and a side cross sectional view respectively of a first preferred embodiment of this invention where a trench PT IGBT device cell with a gate-emitter polysilicon Zener clamp diodes for ESD protection is disclosed. The transistor cell is formed on a P+ substrate 300 coated with a back metal 301 on its rear side. Onto said substrate 300, a moderately N doped epitaxial layer 302 and a lightly N doped epitaxial layer 303 is successively grown. The trench PT IGBT device further includes trenched gates 314 at least a wider trenched gate 315 and at least two wider trenched gates 324 disposed in epitaxial layer 303 with gate insulation layer 330 formed over the walls of the trenches. Base region 304 which is doped with P dopant, extends among the trenched gates 314, 315 and 324 with N+ emitter regions 335 near the top surface of the base region between two adjacent trenched gates. In order to form G-E protection Zenwe diodes, a doped polysilicon layer is formed overlying a portion of the insulating layer 336 as ESD protection diodes comprising multiple back to back Zener diodes arranged as alternating n+ and p regions adjacent to each other. Above the top surface of N− epitaxial layer 303 and the doped poly functioning as protection Zener diodes, a thick oxide layer 340 is deposited as dielectric interlayer, through which a plurality of contact trenches are opened and filled with metal plugs over a Ti/TiN barrier layer to form trench contacts 326, 327, 328 and 329. Among those trenched contacts, 326 and 327 are used to connect emitter regions 335, base regions 304 and a cathode of the Zener diodes together to the emitter metal 332 and 328 and 329 are used to connect trench gate 315 and another cathode of the Zener diodes together to the gate metal 334. Around each bottom of trench 326, a P+ area is implanted to reduce the contact resistance between base regions and metal plugs filled in 326. Specially, some of trench gates 324 are formed underneath contact areas 327 and 328 of the ESD diodes to serve as a buffer trenched gate to avoid a shortage issue between the emitter and trenched gate or the anode and cathode. It means in case trench contacts overetch like prior art in FIG. 2, the trenched contact areas 327 and 328 will penetrate the insulating layer 336 and touch the buffer trenched gates 324 instead of the base region 304 in FIG. 3B. The installment of the buffer trenched gate right below the trenched contact in ESD protection diode overcomes the shortage issue that occurs in the prior art as shown in FIG. 2.

Figure 4A:
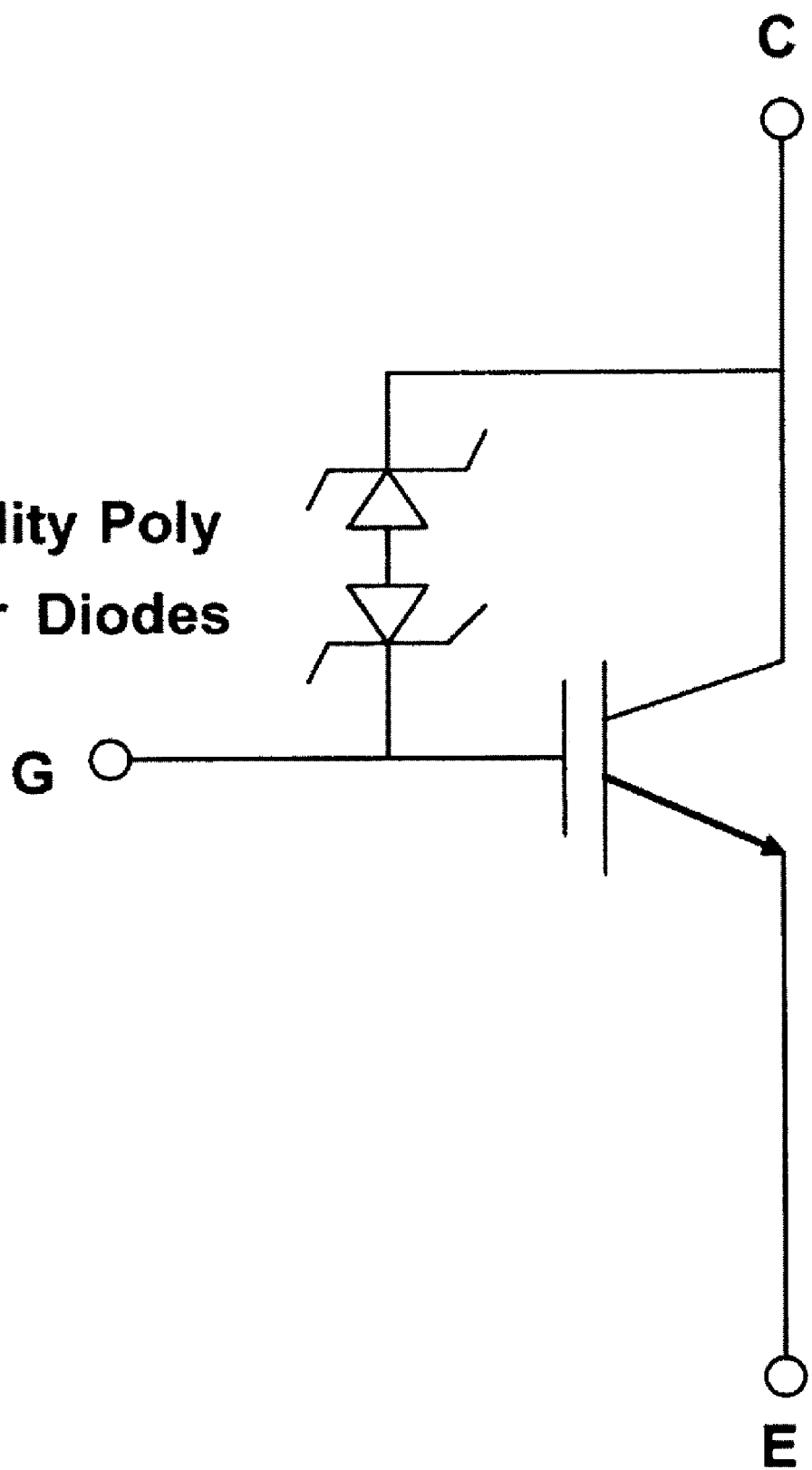
FIG. 4A and FIG. 4B are respectively a circuit diagram and a side cross sectional view of a trench PT IGBT of another embodiment of the present invention.
Figure 4B:
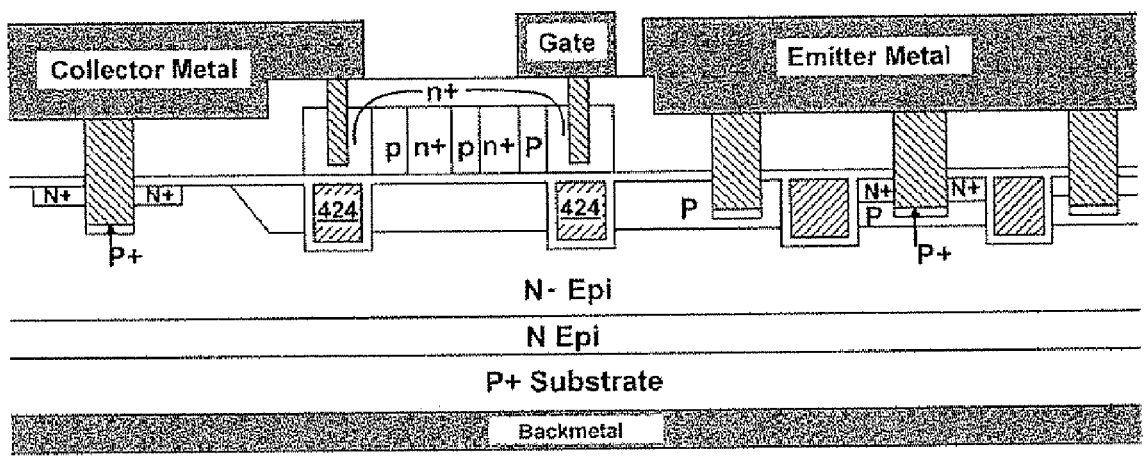

Please refer to FIG. 4A to FIG. 4B for a circuit diagram and a side cross sectional view respectively of another preferred embodiment of this invention where a trench PT IGBT device with gate-collector polysilicon Zener clamp diodes for ESD protection is disclosed. The Zener diodes which are formed between gate metal and collector metal further comprises a plurality of n+ regions next to p doped regions. Underneath each trenched contact of protection diodes, a buffer trenched gate 424 is formed to ward off the occurrence of shortage. It means in case trenched contacts overetch like prior art in FIG. 2, the trenched contact areas will penetrate an insulating layer and touch the buffer trenched gate 424 instead of base region. The installment of the buffer trenched gate right below the trenched contact areas overcomes the shortage issue occurring in the prior art as shown in FIG. 2.

Figure 5A:
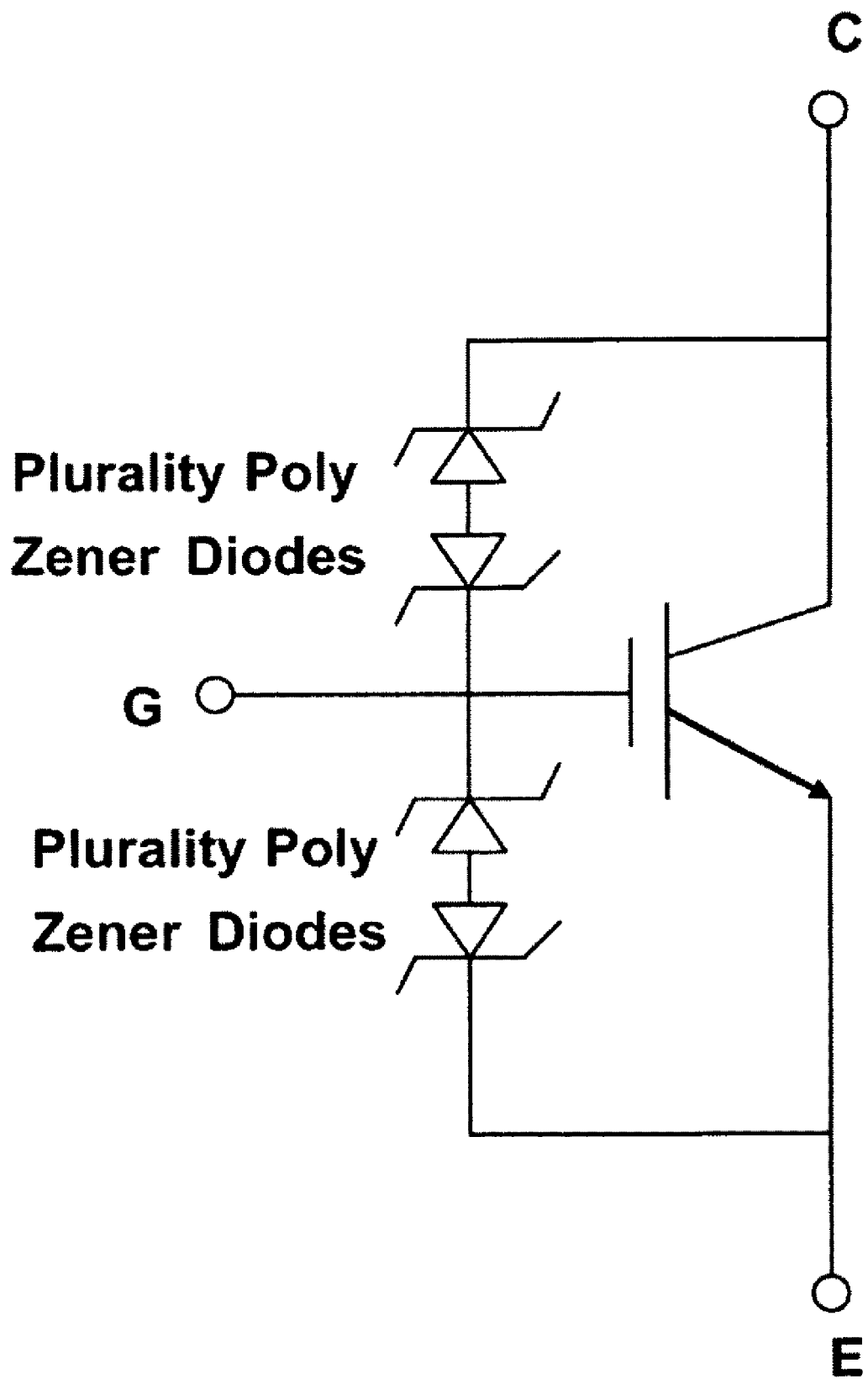
FIG. 5A and FIG. 5B are respectively a circuit diagram and a side cross sectional view of a trench PT IGBT of another embodiment of the present invention.
Figure 5B:
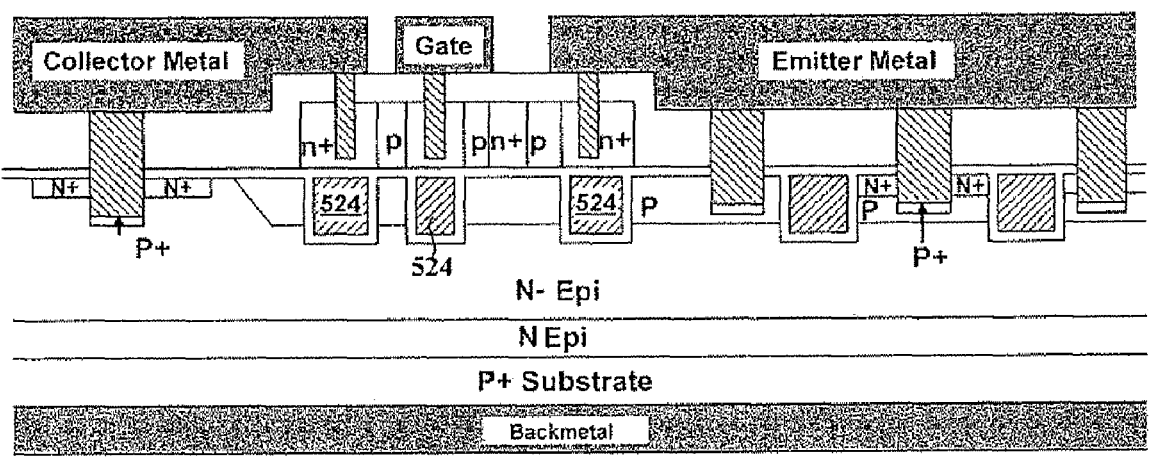

Please refer to FIG. 5A to FIG. 5B for a circuit diagram and a side cross sectional view respectively of another preferred embodiment of this invention where a trench PT IGBT device with a gate-collector clamp Zener diode and gate-emitter polysilicon Zener diode for ESD protection is disclosed. The Zener diodes which are formed between the gate metal and collector metal, and between the gate metal and emitter metal further comprise a plurality of n+ regions next to p doped regions. Underneath each trench contact of protection diodes, a buffer trenched gate 524 is formed to ward off the occurrence of shortage. It means in case trenched contacts overetch like prior art in FIG. 2, the trenched contact area will penetrate an insulating layer and touch the buffer trenched gate 524 instead of base region. The installment of the buffer trenched gate right below the trenched contact area overcomes the shortage issue occurring in the prior art as shown in FIG. 2.

Figure 6:
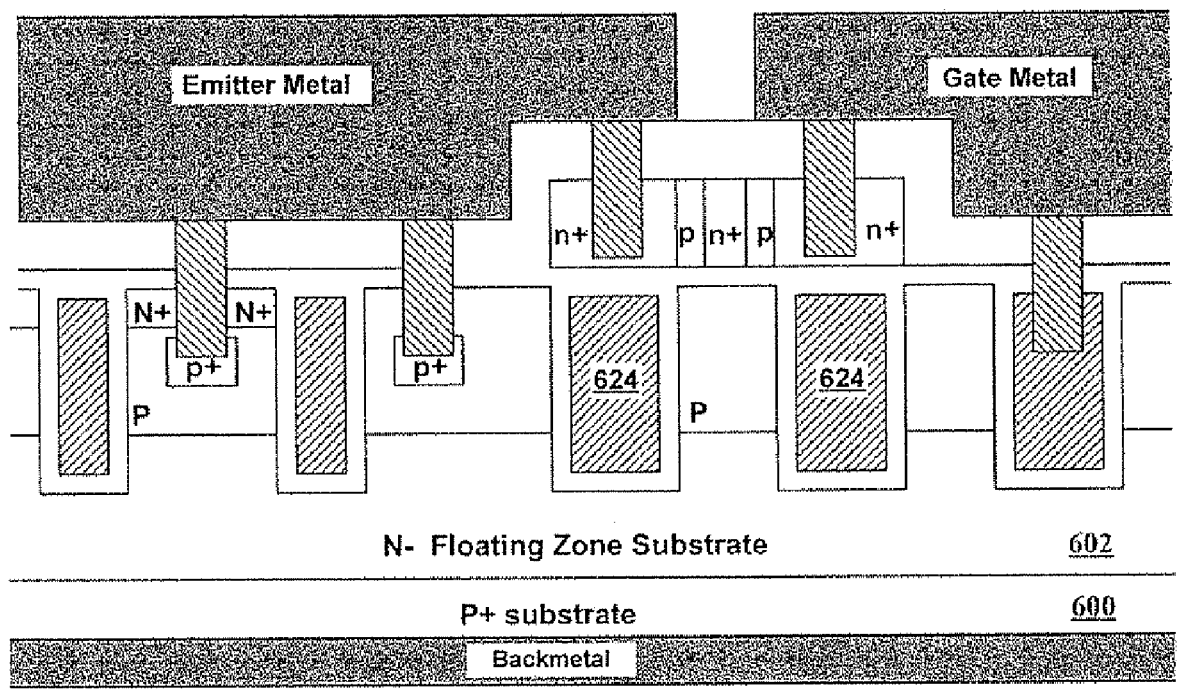
FIG. 6 is a side cross sectional view of a trench NPT IGBT of another embodiment of the present invention.

Please refer to FIG. 6 for a side cross sectional view of another preferred embodiment of this invention where a trench NPT IGBT device cell with gate-emitter polysilicon Zener clamp diodes for ESD protection is disclosed. This semiconductor power device cell is formed in an N− floating Zone 602 grown onto P+ substrate 600. Similar to that of FIG. 3B, the Zener diodes which are formed between gate metal and emitter metal further comprise a plurality of n+ regions next to p doped regions. Underneath each trench contact of protection diodes, a trench gate 624 is formed to ward off the happening of shortage issue.

Figure 7:
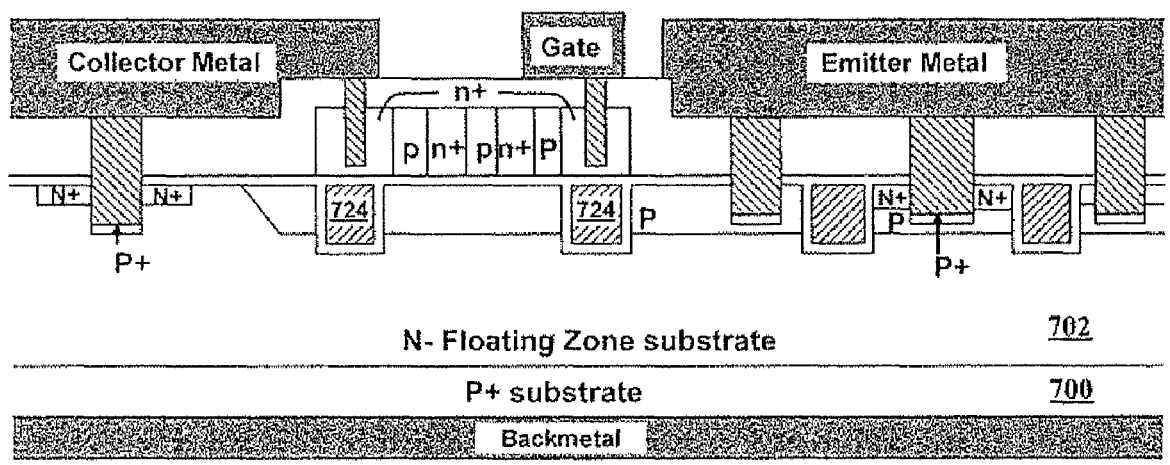
FIG. 7 is a side cross sectional view of a trench NPT IGBT of another embodiment of the present invention.

Please refer to FIG. 7 for a side cross sectional view of another preferred embodiment of this invention where a trench NPT IGBT device cell with gate-collector polysilicon Zener clamp diodes for ESD protection is disclosed. This semiconductor power device cell is formed in an N− floating Zone 702 grown onto P+ substrate 700. Similar to that of FIG. 4B, the Zener diodes which are formed between gate metal and collector metal further comprise a plurality of n+ regions next to p doped regions. Underneath each trench contact of protection diodes, a trench gate 724 is formed to ward off the happening of shortage issue.

Figure 8:
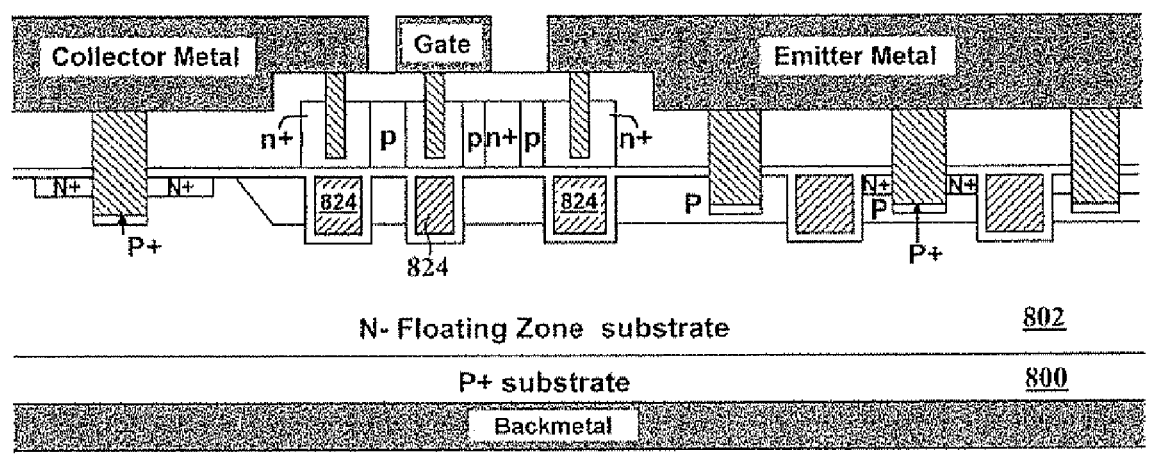
FIG. 8 is a side cross sectional view of a trench NPT IGBT of another embodiment of the present invention.

Please refer to FIG. 8 for a side cross sectional view of another preferred embodiment of this invention where a trench NPT IGBT device with gate-collector and gate-emitter polysilicon Zener clamp diodes for ESD protection is disclosed. This semiconductor power device cell is formed in an N− floating Zone 802 grown onto P+ substrate 800. Similar to that of FIG. 5B, the Zener diodes which are formed between gate metal and collector metal, and between gate metal and emitter metal further comprise a plurality of n+ regions next to p doped regions. Underneath each trench contact of protection diodes, a trench gate 824 is formed to ward off the happening of shortage issue.

Figure 9A:
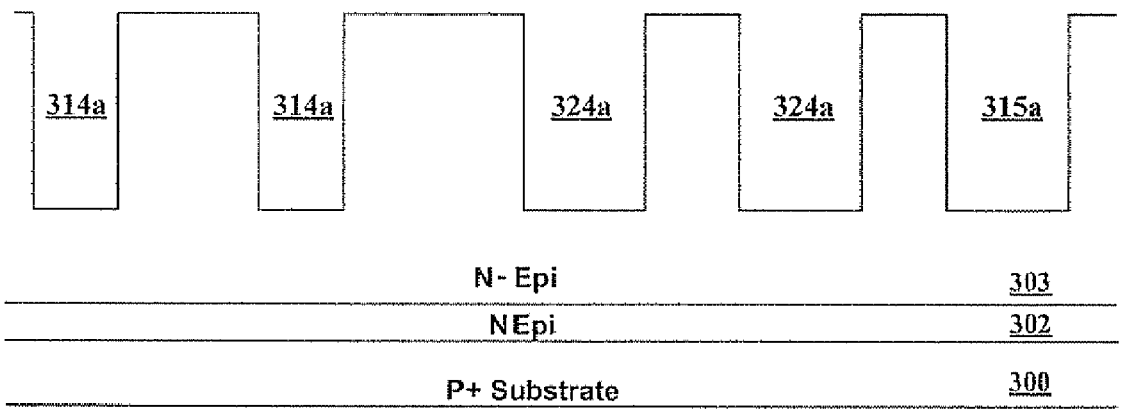
FIGS. 9A to 9G are a serial of side cross-sectional views for showing the processing steps for fabricating a trench PT IGBT shown in FIG. 3B.

In FIG. 9A, a moderately doped N epitaxial 302 is grown on the P+ substrate 300. A trench mask (not shown) is applied to open a plurality of trenches 314a, 315a and 324a in a lightly doped N− epitaxial layer 303 supported on 302 by employing a dry silicon etch process. Then, a sacrificial oxide is grown and then removed to eliminate the plasma damage that may be introduced during a trench etching process.

Figure 9B:
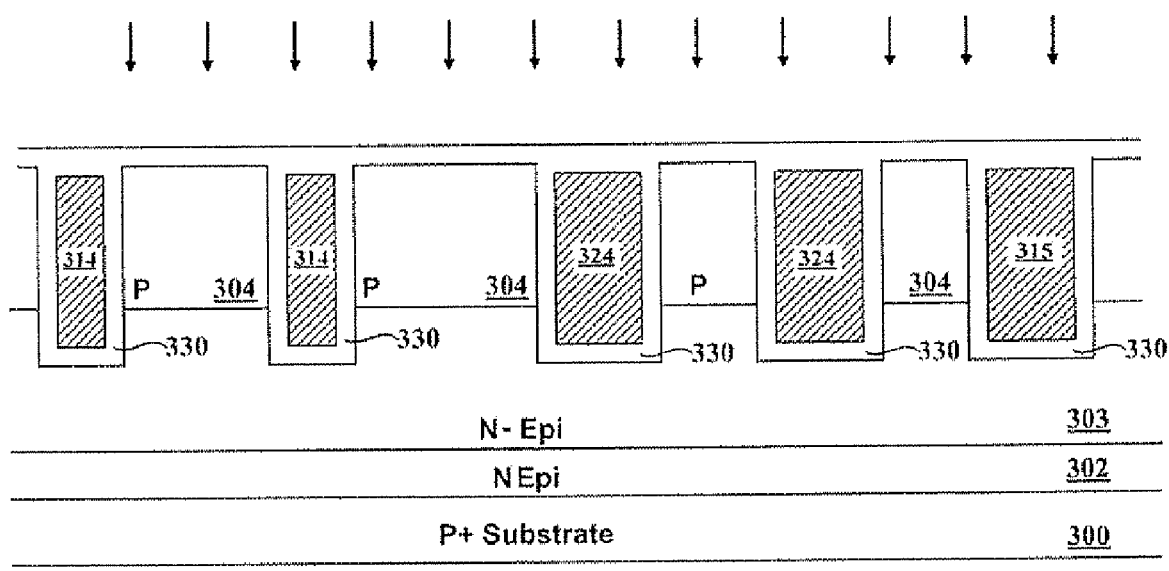

After the trench mask removal, in FIG. 9B, a gate oxide layer 330 is formed on the front surface and the inner surface of gate trenches 314a, 315a, and 324a. Next, the trenches 314a, 315a and 324a are filled with doped polysilicon to form trench gates 314, at least two wider trench gates 324 and at least a wider trench gate 315 for gate connection. Then, the doped polysilicon is etched back or CMP (Chemical Mechanical Polishing) to expose the portion of the gate oxide layer that extends over the surface of N− epitaxial layer. Next, a step of P base Ion Implantation is carried out to form P base 304, and followed by a diffusion step for P base drive-in.

Figure 9C:
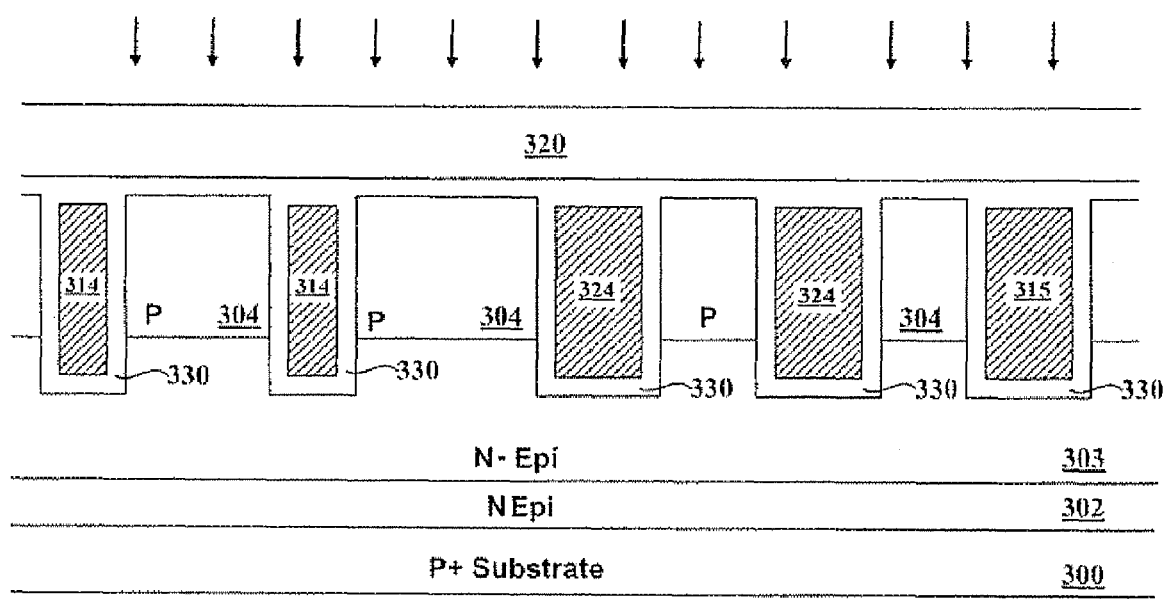

In FIG. 9C, an undoped polysilicon layer 320 in which ESD protection diodes will be formed is deposited over entire structure and then implanted with blank Boron Ion.

Figure 9D:
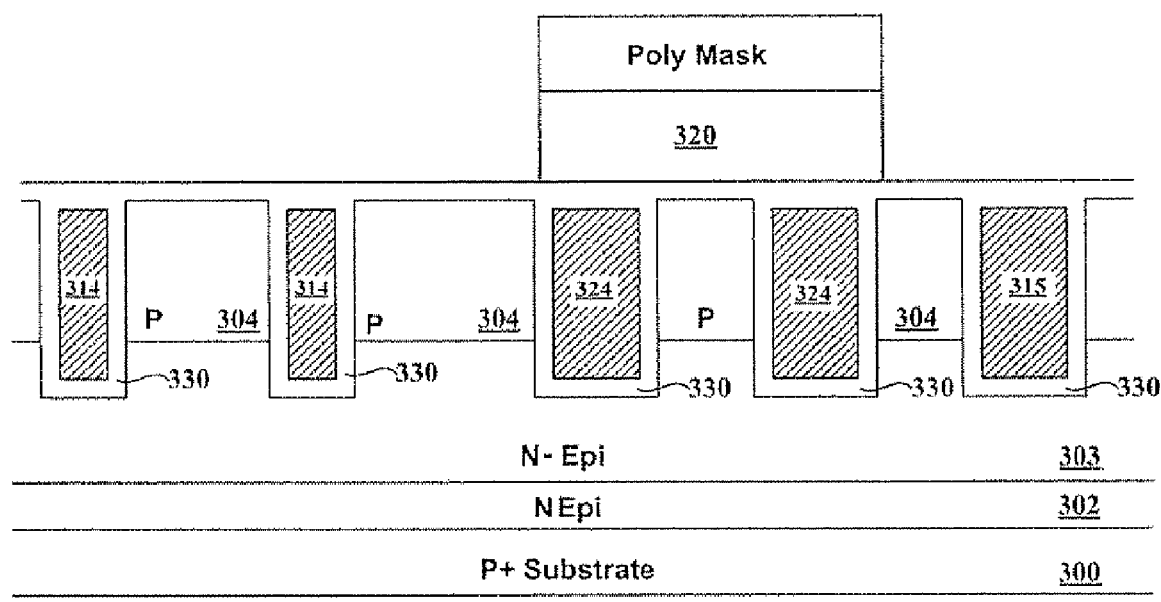

In FIG. 9D, said polysilicon 320 is etched with a poly mask so that it is completely removed from the region where the PT IGBT is defined. Accordingly, the doped polysilicon layer 320 only remains in the region where the ESD protection diode will be formed.

Figure 9E:
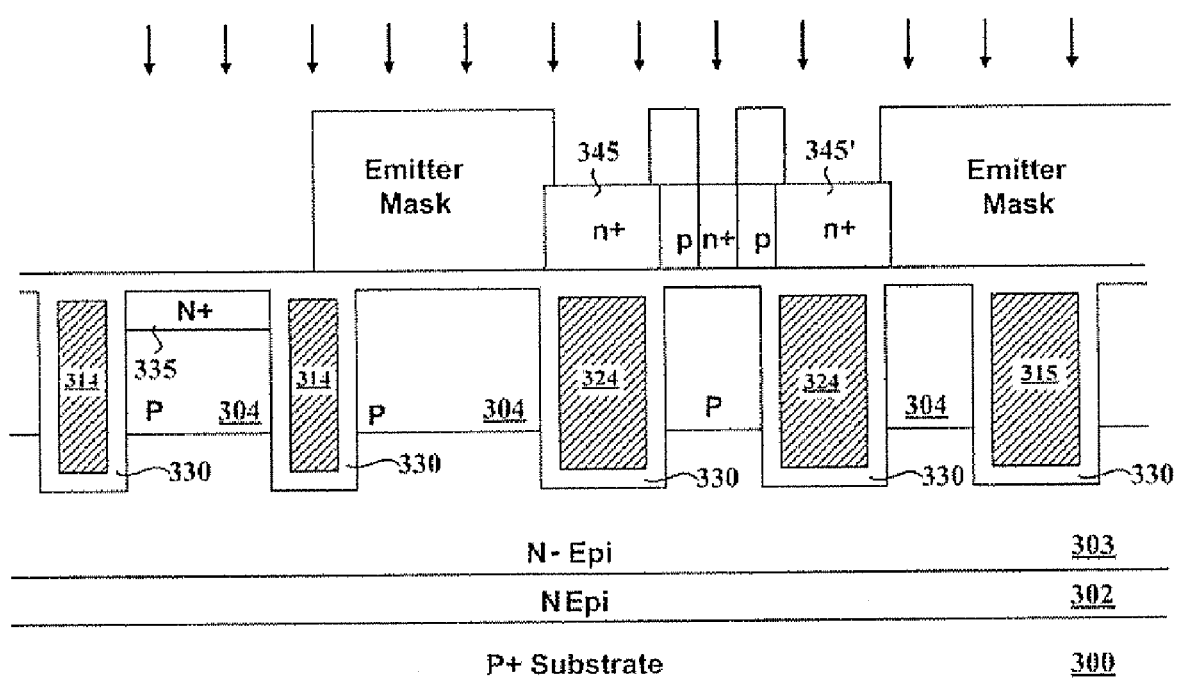

Next, in FIG. 9E, a photo-resist masking process is used to form source mask layer. Said source mask layer defines emitter regions of the trench PT IGBT and n+ cathode regions of the Zener diode. Then, Emitter regions 335 and cathode regions 345 and 345' are then formed by an Arsenic or Phosphorus implantation and diffusion process.

Figure 9F:
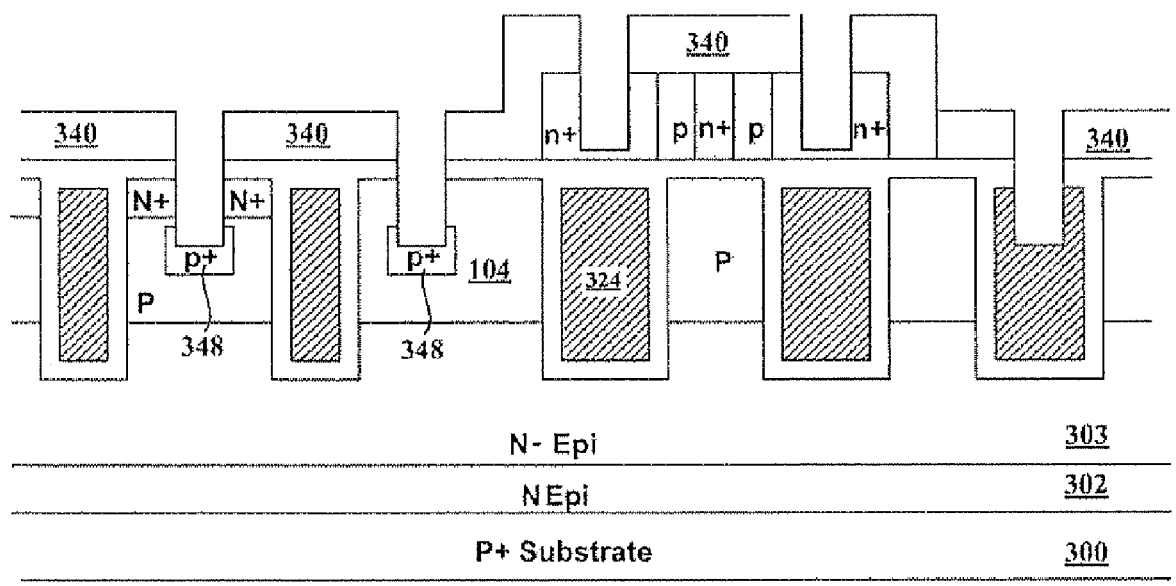

In FIG. 9F, the source mask layer is removed in a conventional manner and a layer of thick oxide 340 is deposited over the structure to act as contact oxide interlayer. Then, a contact mask is used to define contact areas. After exposed, contact trenches are formed by dry oxide and Si etched. Finally, a step of Boron Ion Implantation is implemented to form P+ 348 around the contact trench bottom for achieving ohmic contact between P-base and metal plug.

Figure 9G:
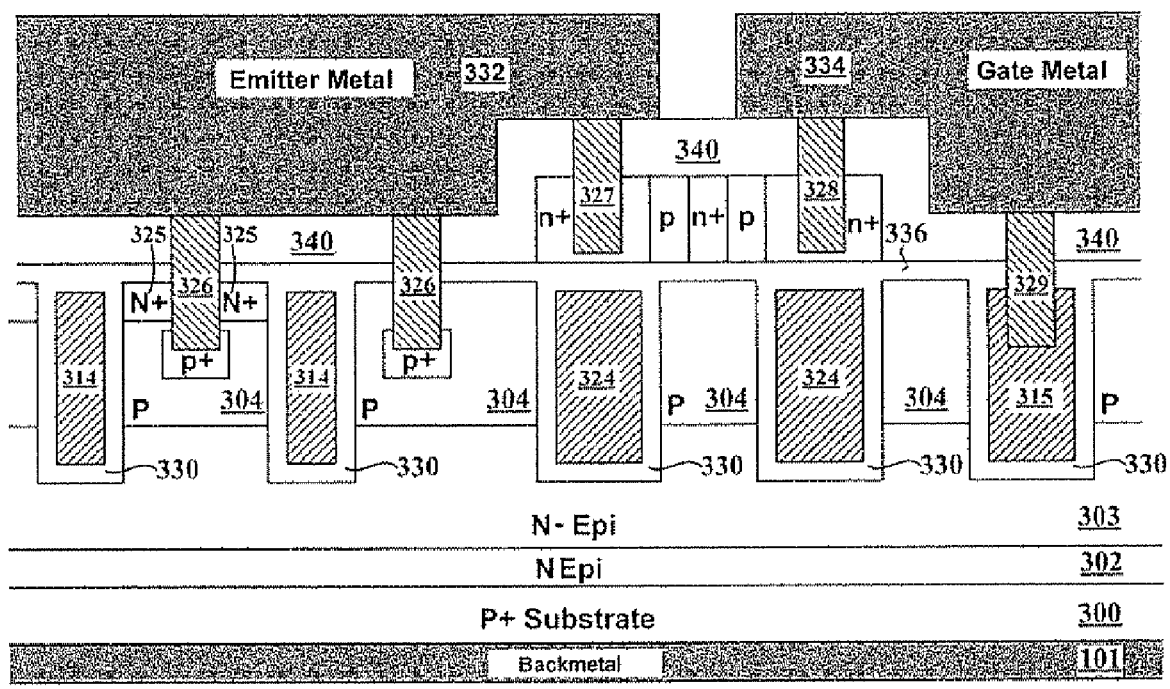

In FIG. 9G, a Ti/TiN/W layer is deposited into contact trenches and then is etched back to form trench contact 326, 327, 328 and 329. Above hole structure, a metal layer is deposited and patterned by a metal mask (not shown) to form emitter metal 332 and gate metal 334 by dry metal etching.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A trench semiconductor device comprising an electrostatic discharge (ESD) protection Zener diode having at least an anode trenched contact disposed right above the center of one buffer trenched gate underneath said ESD protection Zener diode and at least a cathode trenched contact disposed right above the center of another buffer trenched gate underneath said ESD protection Zener diode to prevent a shortage between said anode and cathode of said ESD protection Zener diode;

said anode trenched contact and said cathode trenched contact having a trench width not greater than said buffer trenched gates;

an insulating layer disposed between said ESD protection Zener diode and said buffer trenched gates; and said buffer trenched gates comprising a single doped polysilicon layer filled into said trenched gates and padded with a gate oxide layer.

2. The trench semiconductor device of claim 1, wherein said ESD protection Zener diode comprises multiple back-to-back doped regions in a polysilicon layer doped with dopant ions of a first conductivity type next to a second conductivity type disposed on said insulation layer above said trench semiconductor device.

3. The trench semiconductor device of claim 1 is a trench IGBT, wherein said trench MST comprises a Punch-Through type IGBT and said ESD protection Zener diode comprises multiple back-to-back doped regions in said polysilicon layer doped with N+ dopant ions next to P dopant ions disposed on said insulation layer above said trench IGBT.

4. The trench semiconductor device of claim 1 is a trench IGBT, wherein said trench IGBT comprises a Non-Punch-Through type IGBT and said ESD protection Zener diode comprises multiple back-to-back doped regions in said polysilicon layer doped with N+ dopant ions next to P dopant ions disposed on said insulation layer above said trench IGBT.

5. The trench semiconductor device of claim 1, wherein said anode trenched contact and cathode trenched contacts are spaced apart from said buffer trenched gates underneath an anode trenched contact and cathode trenched contact contact area.

6. The trench semiconductor device of claim 1, wherein said anode trenched contact and cathode trenched contacts penetrate through said insulating layer and touch said buffer trenched gates underneath an anode trenched contact and cathode trenched contact contact area.

7. The trench semiconductor device of claim 1, further comprising a plurality of n+ regions next to p doped regions.

8. A trench IGBT comprising a Zener diode connected between a gate metal and a collector metal of said trench IGBT as a gate-collector (G-C) clamp diode wherein said G-C clamp diode has trench gates underneath contact areas of said G-C diode and at least an anode trenched contact disposed right above the center of one buffer trenched gate underneath said G-C clamp diode and at least a cathode trenched contact disposed right above the center of another buffer trenched gate underneath said G-C clamp diode to prevent a shortage between said anode and cathode of said G-C clamp diode;
   said anode trenched contact and said cathode trenched contact have a trench width not greater than said buffer trenched gates;
   an insulating layer disposed between said G-C clamp diode and said buffer trenched gates; and
   said buffer trenched gates comprise a single doped polysilicon layer filled into said trenched gates padded with a gate oxide layer.

9. The trench IGBT of claim 8, wherein said G-C clamp diode comprises multiple back-to-back doped regions in a polysilicon layer doped with dopant ions of a first conductivity type next to a second conductivity type disposed on said insulation layer above said trench IGBT.

10. The trench IGBT of claim 8, wherein said trench IGBT comprises a Punch-Through type IGBT and said G-C clamp diode comprises multiple back-to-back doped regions in said polysilicon layer doped with N+ dopant ions next to P dopant ions disposed on said insulation layer above said trench IGBT.

11. The trench IGBT of claim 8, wherein said trench IGBT comprises a Non-Punch-Through type IGBT and said G-C clamp diode comprises multiple back-to-back doped regions in said polysilicon layer doped with N+ dopant ions next to P dopant ions disposed on said insulation layer above said trench IGBT.

12. The trench semiconductor device of claim 8, wherein said anode trenched contact and cathode trenched contacts are spaced apart from said buffer trenched gates underneath an anode trenched contact and cathode trenched contact contact area.

13. The trench semiconductor device of claim 8, wherein said anode trenched contact and cathode trenched contacts penetrate through said insulating layer and touch said buffer trenched gates underneath an anode trenched contact and cathode trenched contact contact area.

14. The trench IGBT of claim 8, further comprising a plurality of n+ regions next to p doped regions.

15. A trench IGBT comprising a G-E Protection Zener diode connected between a gate metal and an emitter metal of said trench IGBT and a G-C clamp Zener diode connected between said gate metal and a collector metal of said trench IGBT;
   both said G-E protection Zener diode and said G-C clamp Zener diode have at least one trenched anode contact and at least one trenched cathode contact;
   each of said trenched anode contact and said trenched cathode contact are disposed right above the center of a buffer trenched gate underneath said G-E protection Zener diode or G-C clamp Zener diode;
   said trenched anode and cathode contacts of said G-E protection Zener diode and said G-C clamp diodes have a trench width not greater than said buffer trenched gates underneath said G-E protection diode or said G-C clamp diode;
   an insulating layer disposed between said G-E protection Zener diode and said buffer trenched gates;
   said insulating layer disposed between said G-C clamp Zener diode and said buffer trenched gates;
   said buffer trenched gates comprising a single doped polysilicon layer filled into said trenched gates padded with a gate oxide layer.

16. The trench IGBT of claim 15, wherein said G-E protection and G-C clamp diodes comprise multiple back-to-back doped regions in a polysilicon layer doped with dopant ions of a first conductivity type next to a second conductivity type disposed on said insulation layer above said trench IGBT.

17. The trench IGBT of claim 15, wherein said trench IGBT comprises a Punch-Through type IGBT and said G-E protection and G-C clamp diodes comprise multiple back-to-back doped regions in said polysilicon layer doped with N+ dopant ions next to P dopant ions disposed on said insulation layer above said trench IGBT.

18. The trench IGBT of claim 15, wherein said trench IGBT comprises a Non-Punch-Through type IGBT and said G-E protection and G-C clamp diodes comprise multiple back-to-back doped regions in said polysilicon layer doped with N+ dopant ions next to P dopant ions disposed on said insulation layer above said trench IGBT.

19. The trench semiconductor device of claim 15, wherein said anode trenched contact and cathode trenched contacts are spaced apart from said buffer trenched gates underneath an anode trenched contact and cathode trenched contact contact area.

20. The trench semiconductor device of claim 15, wherein said anode trenched contact and cathode trenched contacts penetrate through said insulating layer and touch said buffer trenched gates underneath an anode trenched contact and cathode trenched contact contact area.

21. The trench IGBT of claim 15, further comprising a plurality of n+ regions next to p doped regions.

* * * * *